(12) United States Patent
Kresse et al.

(10) Patent No.: US 11,588,434 B2
(45) Date of Patent: Feb. 21, 2023

(54) EXPANDABLE SPLICE FOR A SOLAR POWER SYSTEM

(71) Applicant: NEXTracker Inc., Fremont, CA (US)

(72) Inventors: David Kresse, Walnut Creek, CA (US); Sam Heller, San Carlos, CA (US)

(73) Assignee: NEXTRACKER LLC, Fremont, CA (US)

( * ) Notice: Subject to any disclaimer, the term of this patent is extended or adjusted under 35 U.S.C. 154(b) by 57 days.

(21) Appl. No.: 16/444,772

(22) Filed: Jun. 18, 2019

(65) Prior Publication Data

US 2020/0403559 A1    Dec. 24, 2020

(51) Int. Cl.
| | |
|---|---|
| *F24S 25/60* | (2018.01) |
| *H02S 20/10* | (2014.01) |
| *F24S 25/00* | (2018.01) |
| *H02S 20/32* | (2014.01) |
| *H01L 31/042* | (2014.01) |
| *H02S 30/10* | (2014.01) |
| *F24S 25/20* | (2018.01) |

(52) U.S. Cl.
CPC .............. *H02S 20/32* (2014.12); *F24S 25/20* (2018.05); *F24S 25/60* (2018.05); *H01L 31/042* (2013.01); *H02S 20/10* (2014.12); *H02S 30/10* (2014.12); *F24S 2025/014* (2018.05); *F24S 2025/6009* (2018.05)

(58) Field of Classification Search
CPC .......... F16B 7/042; F16B 7/04; F16B 7/0413; F16B 19/02; E04G 7/22; H02S 20/10; H02S 20/32; H02S 30/10; F24S 25/60; F24S 25/20; E04B 1/2403
See application file for complete search history.

(56) References Cited

U.S. PATENT DOCUMENTS

| | | |
|---|---|---|
| 6,634,674 B1 | 10/2003 | Xu |
| 7,406,800 B2 | 8/2008 | Cinnamon et al. |
| 7,832,157 B2 | 11/2010 | Cinnamon |
| 7,866,098 B2 | 1/2011 | Cinnamon |
| 7,987,641 B2 | 8/2011 | Cinnamon |
| 8,505,248 B1 | 8/2013 | Leong et al. |
| 8,578,666 B2 | 11/2013 | Yen |
| 8,695,290 B1* | 4/2014 | Kim .................... F24S 25/67 52/843 |

(Continued)

FOREIGN PATENT DOCUMENTS

| | | |
|---|---|---|
| CN | 203666190 U | 6/2014 |
| EP | 2301382 A1 | 3/2011 |

OTHER PUBLICATIONS

PCT Search Report and Written Opinion issued in PCT Application No. PCT/US2020/038120 dated Sep. 9, 2020.

(Continued)

*Primary Examiner* — Bethany L Martin
(74) *Attorney, Agent, or Firm* — Weber Rosselli & Cannon LLP

(57) ABSTRACT

The present disclosure describes an expandable splice configured for reinforcing a tube of a solar owner system, the splice including a top panel, a bottom panel, a first side panel, a second side panel, and at least one beveled corner panel, wherein the first and second side panels are connected to the top and bottom panels either directly or by the at least one beveled corner panel to form a channel therebetween.

14 Claims, 7 Drawing Sheets

(56) References Cited

U.S. PATENT DOCUMENTS

| | | |
|---|---|---|
| 8,757,567 B2 | 6/2014 | Ciasulli et al. |
| 8,813,460 B2 | 8/2014 | Cinnamon et al. |
| 8,936,164 B2 | 1/2015 | Durney et al. |
| 8,984,839 B2 | 3/2015 | Nix |
| 9,022,021 B2 | 5/2015 | McPheeters |
| 9,057,542 B2 | 6/2015 | Schuit et al. |
| 9,166,521 B2 | 10/2015 | Durney et al. |
| 9,166,526 B2 | 10/2015 | Durney et al. |
| 9,231,518 B2 | 1/2016 | Cinnamon et al. |
| 9,455,662 B2 | 9/2016 | Meine |
| 9,837,954 B2 | 12/2017 | Ash |
| 9,940,412 B2 | 4/2018 | Eich |
| 9,985,577 B2 | 5/2018 | Meine |
| 10,094,596 B2 | 10/2018 | McPheeters |
| 10,128,790 B2 | 11/2018 | Ash |
| 2005/0257453 A1 | 11/2005 | Cinnamon |
| 2010/0236183 A1 | 9/2010 | Cusson et al. |
| 2013/0019921 A1 | 1/2013 | Au |
| 2014/0008312 A1* | 1/2014 | Durney .................. F16B 5/125 211/26 |
| 2015/0007871 A1 | 1/2015 | Durney et al. |
| 2017/0359017 A1* | 12/2017 | Corio ..................... F16M 11/10 |

OTHER PUBLICATIONS

First Examination report issued in Indian Patent application No. 202117057827 dated Jun. 24, 2022, with English translations.
Examination Report No. 1 issued in Australian Patent Application No. 2020297440 dated Nov. 10, 2022, 4 pages.

\* cited by examiner

EXPANDABLE SPLICE FOR A SOLAR POWER SYSTEM

BACKGROUND

1. Technical Field

The present disclosure relates to an expandable splice for a support structure of a solar power system. More particularly, the present disclosure relates to an expandable splice including at least one beveled corner panel and configured to transition between a narrow configuration and an expanded configuration to reinforce the support structure of the solar power system.

2. Discussion of Related Art

Solar power has long been viewed as an important alternative energy source. To this end, substantial efforts and investments have been made to develop and improve upon solar energy collection technology. Of particular interest are residential-, industrial- and commercial-type applications in which relatively significant amounts of solar energy can be collected and utilized in supplementing or satisfying power needs. One way of implementing solar energy collection technology is by assembling an array of multiple solar modules.

Solar modules can employ solar panels made of silicon or other materials (e.g., III-V cells such as GaAs) to convert sunlight into electricity. Solar panels typically include a plurality of photovoltaic (PV) cells interconnected with wiring to one or more appropriate electrical components (e.g., switches, inverters, junction boxes, etc.).

Most solar power systems place an array of solar modules at a location where sunlight is readily present. This is especially true for residential, commercial, or industrial applications in which multiple solar modules are desirable for generating substantial amounts of energy.

In some arrangements, solar modules are placed side-by-side in an array. Each solar module can be mounted to a rail system further mounted onto a horizontal support structure which is secured to at least a ground-based support structure, such as a solar tracker pile, or a roof-based support structure, such a roof rail or mount.

When the array of solar modules is exposed to high winds or rapidly changing winds, the array of solar modules will transfer the wind forces into the rail system and the horizontal support structure, or torque tube. The forces on the structure due to wind can be intensified or concentrated at the connections, joints, and fasteners in the rail system and horizontal support structure potentially resulting in deflection, bending, or failure along a length of the support structure. Any such deflection or bending can cause the array to be less efficient due to lack of total alignment and/or the inability of the torque tube to properly pivot due to the distortion or bending. Additional support may be applied to the array of solar modules or the specific point of attachment, however such support does not necessarily distribute the load or strain sufficiently along a length of the torque tube to prevent distortion or bending. Thus, there remains a continuing need to provide a device configured to and a capable of distributing a load or strain along a length of a support structure of a solar power system or tracker and thereby prevent deflection, bending, or failure of the support structure when exposed to high wind loads.

SUMMARY

The present disclosure describes an expandable splice configured to reinforce a support structure, such as a torque tube, of a solar power system. The expandable splice is configured to transition between a narrow configuration, which is designed to be easily inserted into a support channel of a support structure of a solar power system, and an expanded configuration, which is designed to provide additional strength to the support structure to prevent warping or bowing of the support structure when exposed to the elements of nature, such as high wind, snow, hail, lightning, etc. The expandable splice includes at least one beveled corner panel. The expandable splice, in the narrow configuration, includes at least one side panel including two points of transition wherein the side panel is bent in at least two places.

In some embodiments, the expandable splice described herein includes a top panel, a bottom panel, a first side panel, a second side panel, and at least one beveled corner panel. The first side panel may include a first converging panel attached to a first end of a first median panel and a first diverging panel attached to a second end of the first median panel. The first panel includes at least two points of transition or bend points wherein the first converging and diverging walls meet opposite ends of the first median panel. The second side panel may include a second converging panel attached to a first end of a second median panel and a second diverging panel attached to a second end of the second median panel. The second panel includes at least two points of transition or bend points wherein the second converging and diverging walls meet opposite ends of the second median panel. The first and second side panels may be connected to the top and bottom panels either directly or by the at least one beveled corner panel to form a splice channel therebetween.

The at least one beveled corner in the narrow configuration allows the expandable splice to more easily fit within a channel of the support structure or torque tube. The at least one beveled corner in the expanded configuration secures the side panel extending therefrom against a length of the inner surface of the support structure or torque tube thereby distributing any future load or strain along a length of the support structure.

In some embodiments, the expandable splices include a plurality of beveled corner panels. In some embodiments, the expandable splices include two, three, or four beveled corner panels.

The splices described herein include at least one, if not more than one, beveled corner panel in both the narrow configuration and the expanded configuration. In some embodiments, the splices described herein include two, three, or four beveled corner panels in both the narrow configuration and the expanded configuration. In some embodiments, the number of beveled corner panels remains the same in both the narrow and expanded configurations of the splice.

The present disclosure further provides a solar power system, such as a solar tracker, including at least one of the expandable splices described herein. In some embodiments, the system may include at least one support structure, such as a torque tube, including a support channel and at least one expandable splice configured to be positioned within the support channel of the support structure. The expandable splice includes at least a top panel, a bottom, panel, a first and second side panels, and at least one beveled corner panel. In some embodiments, the splice is positioned within the support channel in a narrow configuration, wherein at least one, if not both, of the first and second side panels include a converging panel attached to a first end of a median panel and a diverging panel attached to a second end of the median panel. In some embodiments, the splice is positioned within the support channel in an expanded configuration, wherein at least one, if not both, of the first and second side panels are generally perpendicular to the top and bottom panels and at least one, if not both, of the first and second walls are attached to the top or bottom wall by a beveled corner panel. In some embodiments, the support structure is a torque tube of a solar tracker system. In some embodiments, the support structure is a beam, purlin, or rail of a solar power system.

The present disclosure further provides a kit for solar power system including at least one of the expandable splices described herein. The expandable splice including at least a top panel, a bottom, panel, a first and second side panels, and at least one beveled corner panel. In some embodiments, the splice may be in a narrow configuration, wherein at least one, if not both, of the first and second side panels include a converging panel attached to a first end of a median panel and a diverging panel attached to a second end of the median panel. In some embodiments, the kit may include at least one torque tube defining a tube channel and at least one expandable splice as described herein and configured to be positioned within the tube channel of the torque tube. In some embodiments, the kit may further include at least one solar module. In embodiments wherein the kit includes a support structure, the splice may be positioned with the support structure in either the narrow or expanded configuration.

BRIEF DESCRIPTION OF THE DRAWINGS

Various aspects of the present disclosure are described hereinbelow with reference to the drawings, which are incorporated in and constitute a part of this specification, wherein.

DETAILED DESCRIPTION

The present disclosure describes an expandable splice configured to reinforce a support structure, such as a torque tube, of a solar power system. The solar power system may be any type of solar power system, such as a roof-top solar power system, or a solar tracker system, and the like. In particular embodiments, the solar power system is a solar tracker system including at least one ground-based support structure, such as a pile, and an array of solar modules mounted and secured to the ground-based support structure and in particular a rail or torque tube extending generally perpendicular from the support structure (see FIGS. 3A-3C).

Figure 4A:
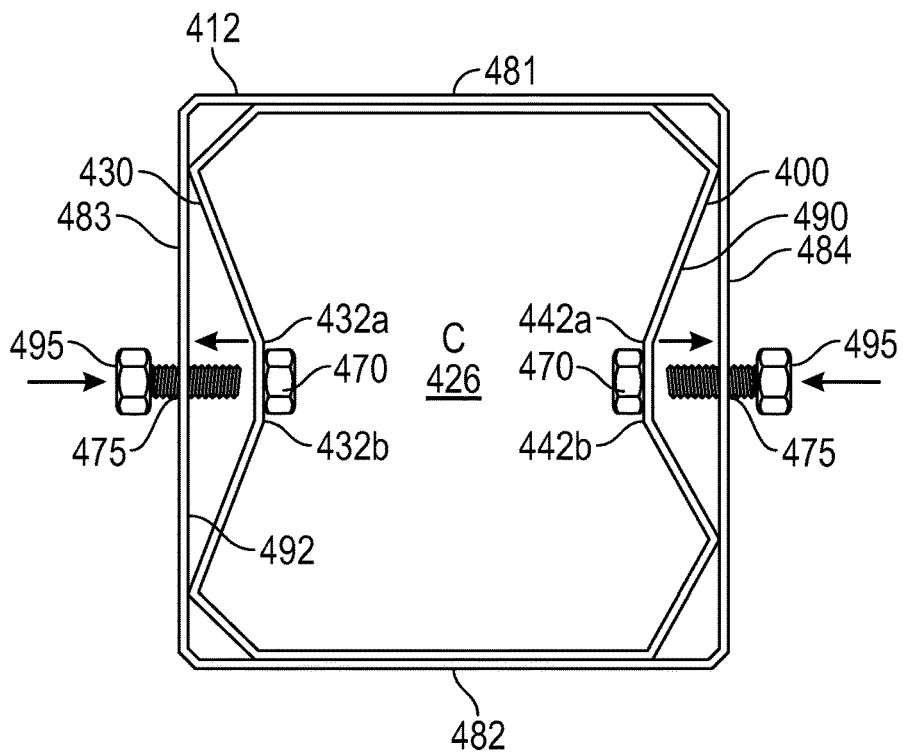
FIG. 4A is a cross-sectional side view of an expandable splice in a narrow configuration as described in at least one embodiment herein.
Figure 4B:
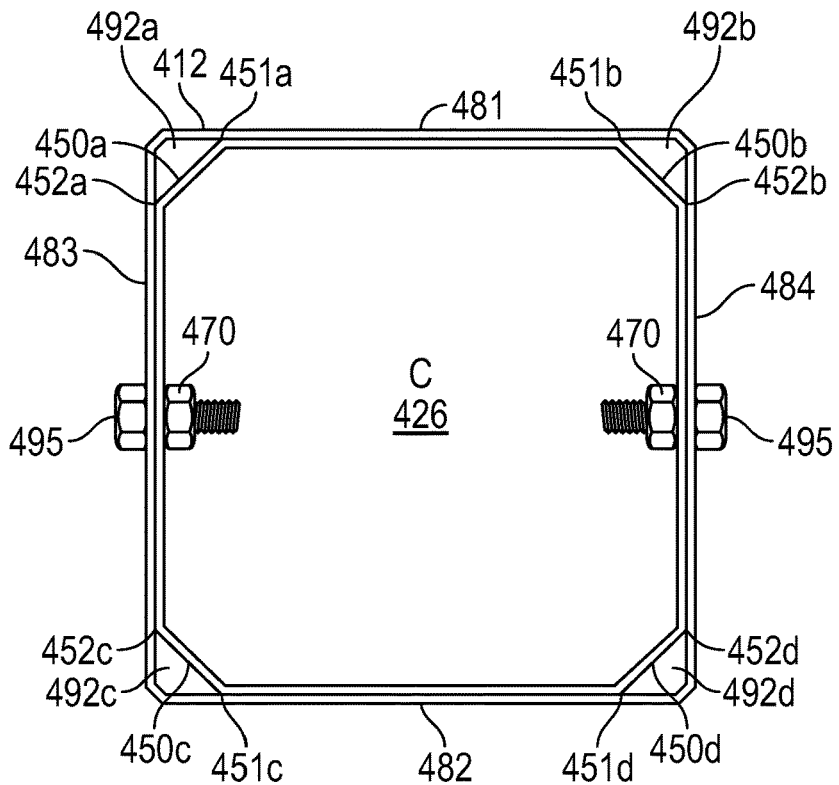
FIG. 4B is a cross-sectional side view of the expandable splice in FIG. 4A in the expanded configuration as described in at least one embodiment herein.

The expandable splice is configured to transition between a narrow configuration (see FIGS. 1A-2D) and an expanded configuration (see FIG. 4B). In some embodiments, the expandable splice includes at least one beveled corner panel and at least one side panel including two or more transition points or bend points.

Figure 1A:
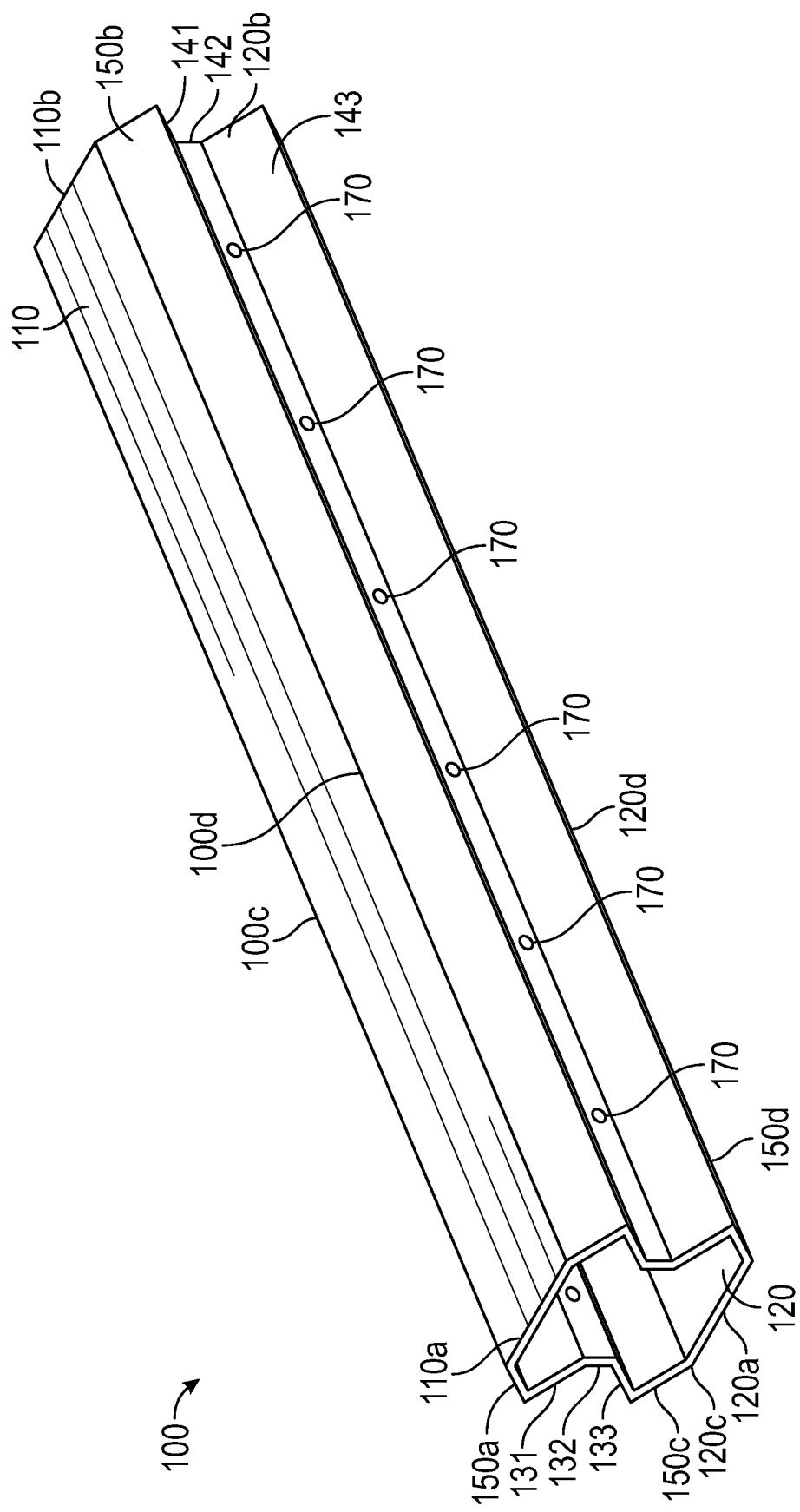
FIG. 1A is a perspective view of an expandable splice in a narrow configuration as described in at least one embodiment herein.
Figure 1B:
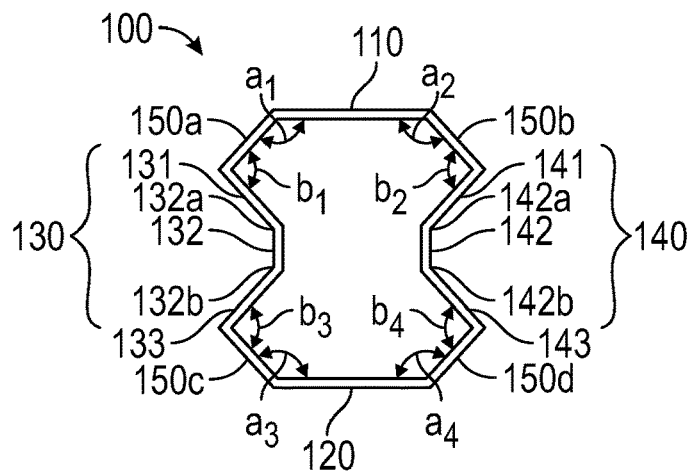
FIG. 1B is a cross-sectional side view of the expandable splice of FIG. 1A and as described in at least one embodiment herein.

Turning now to FIGS. 1A and 1B, the expandable splice 100 described herein includes a top panel 110, a bottom panel 120, a first side panel 130, a second side panel 140, and at least one beveled corner panel 150a-d. The top and bottom panels 110, 120, as shown and in some embodiments, may be generally planar and extend along a longitudinal axis (A) of the splice from a proximal end portion 110a, 120a to a distal end portion 110b, 120b and in a direction transverse to the longitudinal direction from a first side end portion 110c, 120c to a second side end portion 110d, 120d.

The top panel 110, bottom panel 120, first side panel 130, second side panel 140, and at least one beveled corner panel 150a-d form a closed outer perimeter defining a splice channel 160 therebetween. The expandable splice 100 includes an outer surface 101 and inner surface 102. The expandable splice 100 is depicted in FIGS. 1A and 1B in a narrow configuration wherein the expandable splice 100 displays a smaller cross-sectional area than the expanded configuration (see FIG. 4B) and is designed to be slid into a support channel of support structure or torque tube of a solar power system prior to transitioning to the expanded configuration.

The first side panel 130 includes a first converging panel 131 attached to a first end 132a of a first median panel 132 and a first diverging panel 133 attached to a second end 132b of the first median panel 132. The first panel 130 includes at least two transition points wherein the first converging panel 131 meets the first end 132a of the first median panel 132 and the first diverging panel 133 meets the second end 132b of the first median panel 132. The transition points being configured and designed to be the location wherein the first side panel 130 will expand when the splice 100 transitions from the narrow configuration to the expanded configuration. In some embodiments, the transition points are also configured and designed to be the location wherein the first side panel 130 will constrict or retreat when the splice 100 transitions from the expanded configuration to the narrow configuration.

The second side panel 140 includes a second converging panel 141 attached to a first end 142a of a second median panel 142 and a second diverging panel 143 attached to a second end 142b of the second median panel 142. The second side panel 140 includes at least two transition points wherein the second converging panel 141 meets the first end 142a of the second median panel 142 and the second diverging panel 143 meets the second end 142b of the second median panel 142. The transition points of the second side panel being configured and designed to be the location wherein the second side panels will expand when the splice transitions from the narrow configuration to the expanded configuration. In some embodiments, the transition points are also configured and designed to constrict or retreat when the splice transitions from the expanded configuration to the narrow configuration.

The first and second median panels 132, 142 also include a plurality of splice holes 170 positioned intermittently along a length of the median panels 132, 142. The splice holes 170 are configured to receive a fastener used to secure the splice 100 within the support structure or torque tube. A fastener will also draw the side panels 130, 140 of the splice 100 outwardly away from a center C of the splice channel 160, towards at least one support side wall of the support structure. In some embodiments, the splice holes 170 are preloaded with the fastener, in the narrow configuration, prior to insertion into the support channel of the support structure. In some embodiments, the fastener is added to the splice hole 170 after insertion of the splice 100 into the support channel of the support structure.

As further depicted in FIGS. 1A and 1B, the first and second side panels 130, 140 are each connected to the top and bottom panels 110, 120 by a beveled corner panel 150a-d to form a closed outer perimeter of the splice 100 with the channel 160 therebetween. A beveled corner panel is a generally planar wall panel which extends between one of the top or bottom panels of splice and one of the first or second side panels of the splice at an obtuse angle. In some embodiments, a first angle between the beveled corner panel and one of the top or bottom panels is an obtuse angle ($a_1$, $a_2$, $a_3$, $a_4$). In some embodiments, a second angle between the beveled corner panel and one of the first or second side panels is an obtuse angle ($b_1$, $b_2$, $b_3$, $b_4$). In some embodiments, both the first and second angles are obtuse angles. For example, in some embodiments, a beveled corner panel 150a may extend from the top panel 110 to the first side panel 130 creating an obtuse angle between the beveled corner panel 150a and at least one, if not both, the top panel 110 or the first side panel 130, and particularly the first converging panel 131. In another example, in some embodiments, a beveled corner panel 150b may extend from the top panel 110 to the second side panel 140 creating an obtuse angle between the beveled corner panel 150b and at least one, if not both, the top panel 110 or the second side panel 140, and particularly the second converging panel 141. In yet another example, in some embodiments, a beveled corner panel 150c may extend from the bottom panel 120 to the first side panel 130 creating an obtuse angle between the beveled corner panel 150c and at least one, if not both, the bottom panel 120 or the first side panel 130, and particularly the first diverging panel 133. In yet another example, in some embodiments, a beveled corner panel 150d may extend from the bottom panel 120 to the second side panel 140 creating an obtuse angle between the beveled corner panel 150d and at least one, if not both, the bottom panel 120 or the second side panel 140, and particularly the second diverging panel 143.

In FIGS. 1A and 1B, in some embodiments, the splice 100 includes a first top beveled corner panel 150a, a first bottom beveled corner panel 150b, a second top beveled corner panel 150b, and a second bottom beveled corner panel 150d. The first top beveled corner panel 150a connects the top end 131a of the first converging panel 131 to the first side end portion 110c of the top panel 110. The first bottom beveled corner panel 150c connects a bottom end 133b of the first diverging panel 133 to a first side end portion 120c of the bottom panel 120. The second top beveled corner panel 150b connects the top end 141a of the second converging panel 141 to the second side end portion 110d of the top panel 110. The second bottom beveled corner panel 150d connects a bottom end 143b of the second diverging panel 143 to a second side end portion 120d of the bottom panel 120.

In some embodiments, the obtuse angle created between the beveled corner panel and the neighboring panel it connects to, i.e., the top, bottom or side panel, may range from about 95 to 170 degrees. In some embodiments, the obtuse angle created between the beveled corner panel and the neighboring panel it connects to may range from about 100 to 150 degrees. In some embodiments, the angle created between the beveled corner panel and the neighboring panel it connects to may range from about 120 to 140 degrees.

As depicted in FIGS. 2A-2D, the expandable splice 200a, 200b, 200c, 200d described herein may include one or more beveled corner panels 250a-c. In some embodiments, the expandable splices include one, two, three, or four beveled corner panels.

As further depicted in FIGS. 2A-2D, the expandable splice 200a, 200b, 200c, 200d described herein include at least 8 vertices. In some embodiments, the expandable splice 200b, 200c, 200d described herein include at least 10 vertices. In some embodiments, the expandable splice 200b described herein include at least 12 vertices.

In still other embodiments, the expandable splice described herein includes 10-12 vertices. In some embodiments, the expandable splice described herein includes 12 vertices.

Figure 2A:
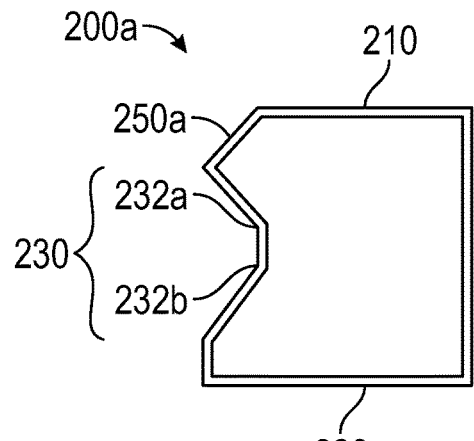
FIGS. 2A-2D are cross-sectional side views of various expandable splice configurations as described in at least one embodiment herein.

As illustrated in FIG. 2A, in some embodiments, the expandable splice 200a may include only one beveled corner panel 250a and only one side panel including two transition points 232a, 232b. The splice 200a including 8 vertices.

Figure 2B:
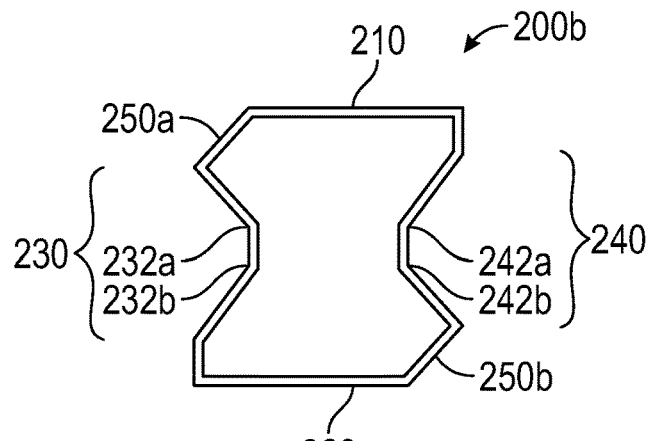
Figure 2C:
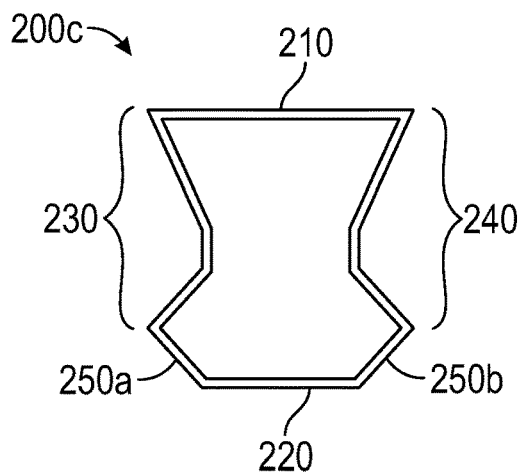
Figure 2D:
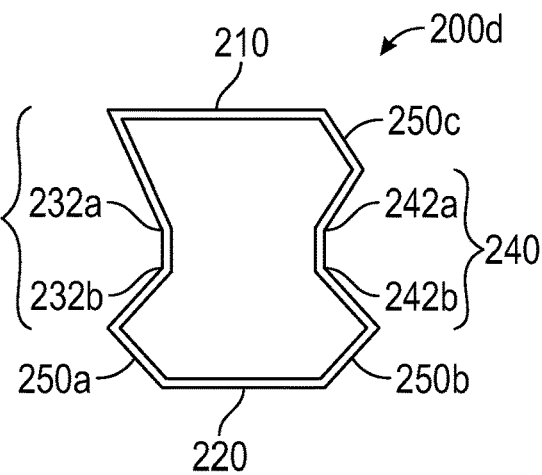

In some embodiments, as illustrated in FIGS. 2B and 2C, the expandable splice 200b, 200c may include only two beveled corner panels 250a, 250b and two side panels 230, 240, each side panel including two transition points 232a, 232b, 242a, 242b. In FIG. 2B, the expandable splice 200b includes a first and second beveled corner panel 250a, 250b positioned on opposite ends, i.e., one attached to the top panel 210 and one attached to the bottom panel 220, and opposite sides, i.e., on different first and second side panels 230, 240. In FIG. 2C, the expandable splice 200c includes a first and second beveled corner panel 250a, 250b positioned on the same end, i.e., both attached to the bottom panel 220. FIG. 2D depicts an expandable splice 200d including first, second and third beveled corner panels 250a, 250b, 250c, and two side panels including at least two points of transition 232a, 232b, 242a, 242b. The splices 200b, 200c, 200c including 10-12 vertices.

Figure 3A:
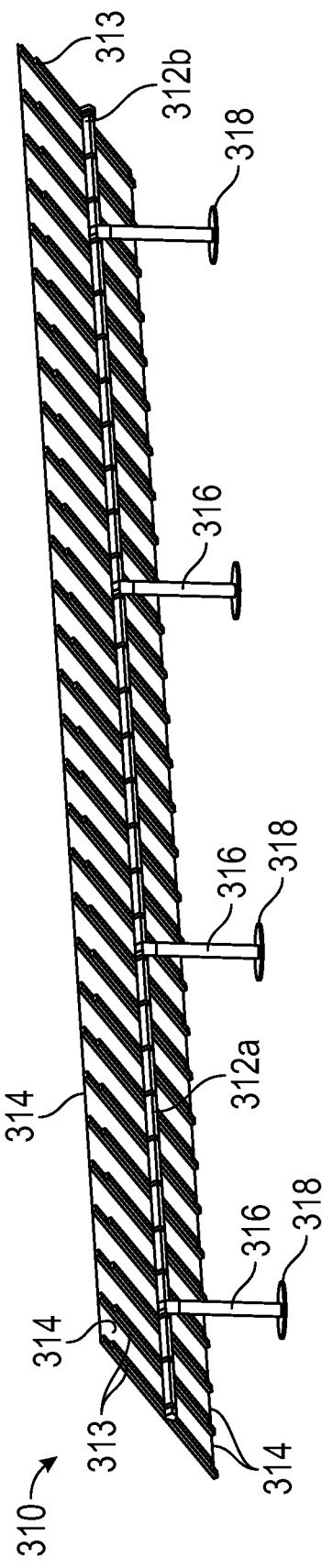
FIG. 3A is a perspective view of a solar tracker suitable for incorporating the expandable splices provided herein as described in at least one embodiment herein.
Figure 3B:
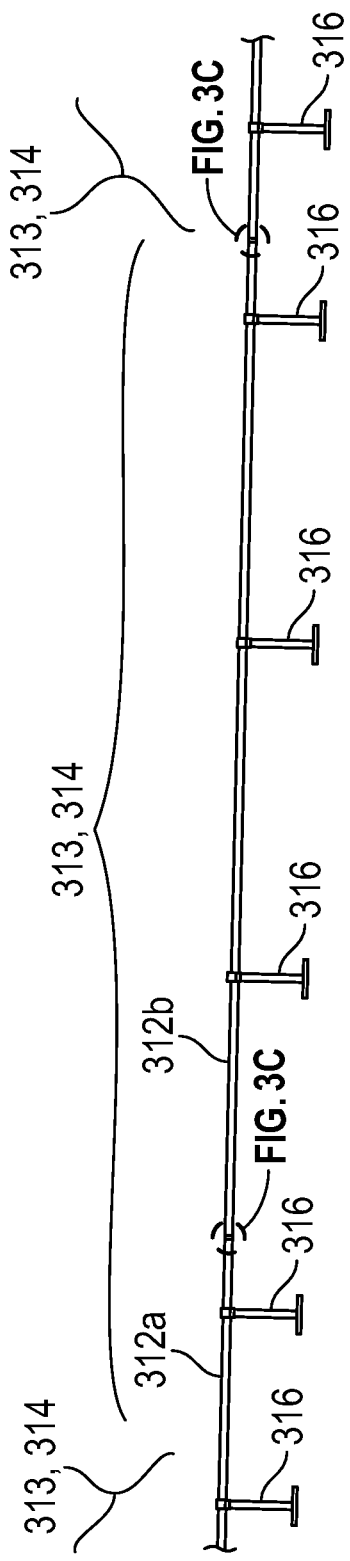
FIG. 3B is a side view of the solar tracker of FIG. 3A, without the array of solar modules depicted, as described in at least one embodiment herein.

Turning to FIGS. 3A-3B, which depict a solar power system 310, such as a solar power tracker, including a plurality of solar modules 314 positioned on a plurality of rails 312 extending from a plurality of generally horizontal support structures 312, i.e., torque tubes. The support structures or torque tubes supported vertically by ground posts 316 which extend vertically from the ground or a base near the ground.

Figure 3C:
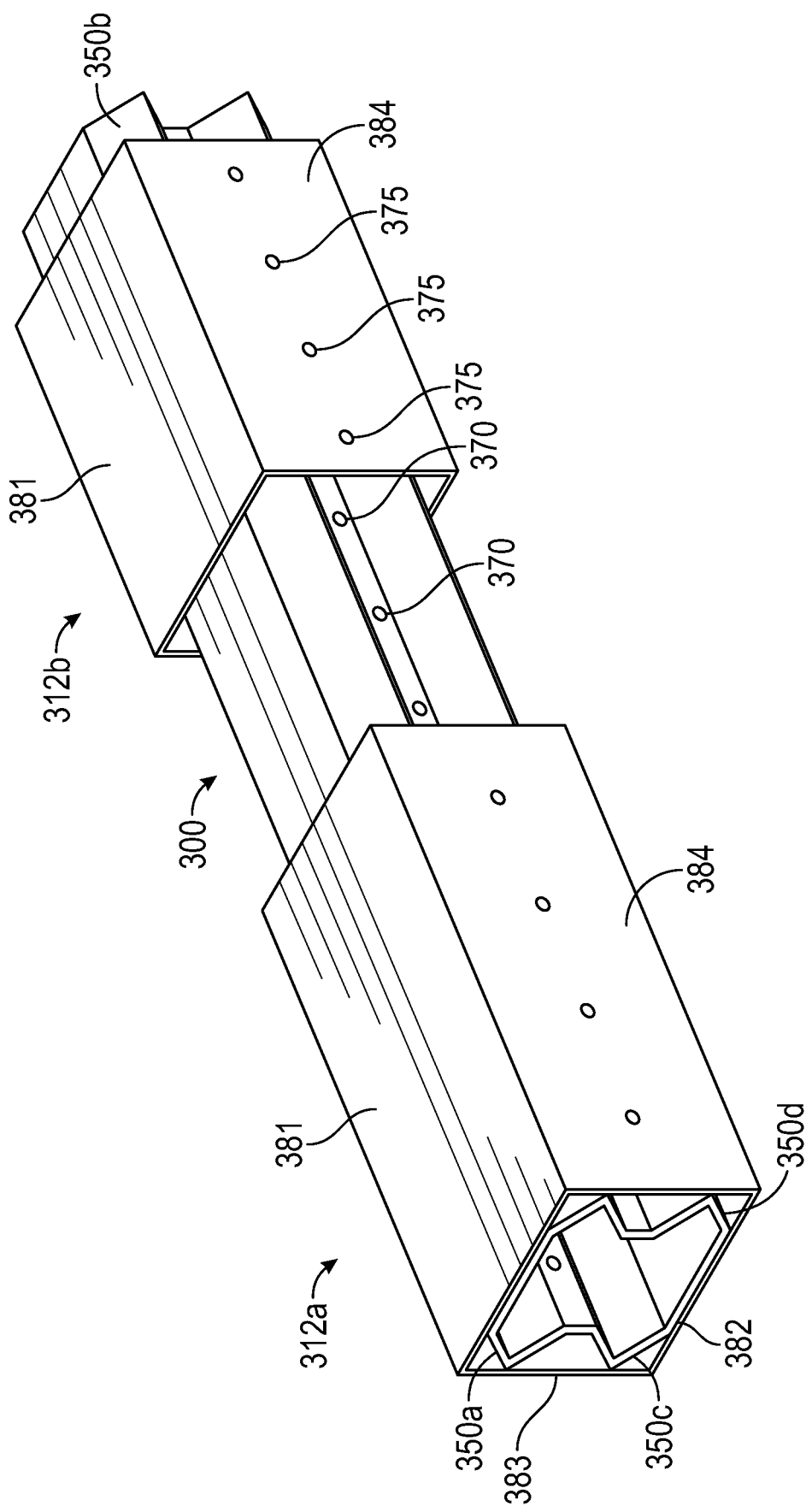
FIG. 3C is a perspective view of an expandable splice positioned within a support structure of the solar tracker of FIGS. 3A and 3B as described in at least one embodiment herein.

As shown in FIG. 3C, the expandable splice 300 described herein is configured to be inserted within a support channel of the support structure or torque tube 312 to add strength to the support structure 312 to prevent deflection or warping of the support structure 312. In FIG. 3C, an expandable splice 300 is shown in a narrow configuration and inserted within a support channel of a first torque tube 312a and a second torque tube 312b (a portion of the second torque tube 312b neighboring the first torque tube 312a is removed from the figure to allow better access to the expandable splice 300 positioned therein). The splice 300 includes four beveled corner panels 350a-d in the narrow configuration and the splice holes 370 are aligned with the support holes 375 of the torque tubes 312a, 312b such that a fastener (not shown) can be passed through the support holes 375 and received within the splice holes 370 to secure the splice 300 into a fixed position relative to the torque tubes 312a, 312b. As shown, the torque tubes 312a, 312b are each generally rectangular including a top support wall 381, bottom support wall 382, and two side support walls 383, 384 all connected to form a closed outer perimeter. The top and bottom support walls 381, 382 being generally parallel to each other and generally perpendicular to the first and second side support walls 381, 382 extending therebetween. Other geometric configurations of the torque tube can also be used.

Figure 4C:
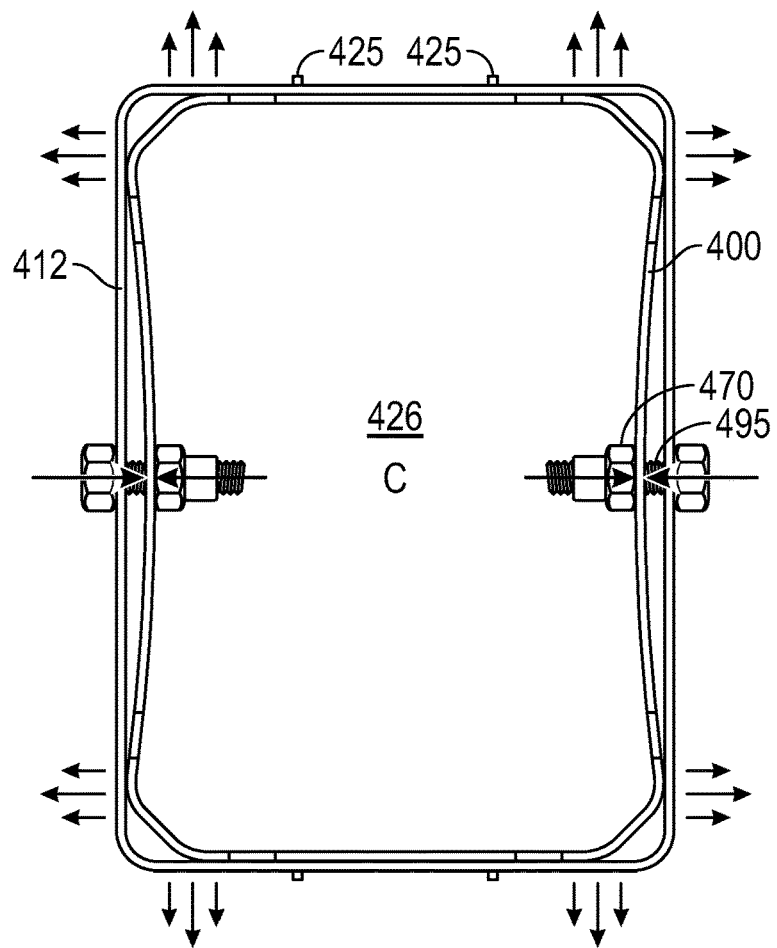
FIG. 4C is a schematic cross-sectional side view of the expandable splice in FIG. 4A as described in at least one embodiment herein.

In FIGS. 4A-4C, the expandable splice 400 includes splice holes 470 which are threaded to receive a threaded fastener 495, such as a screw or bolt. In some embodiments, the hole is simply threaded through the thickness of the sidewall. In some embodiments, the thickness of the sidewall may be increased around the splice hole to accommodate a threaded weld nut or threaded rivet nut configured to receive the fastener. In still other embodiments, the splice hole may be formed by thermal drilling through the splice wall which creates a threaded hole with increased thickness of the wall without having to add or secure the additional material at or around the opening.

In some embodiments, the splice holes are not threaded, and the fastener is simply positioned through the splice hole and secured to a nut positioned on an end thereof, the nut being positioned inside the splice channel of the splice.

As depicted, in some embodiments, a fastener 495 is passed through the first and second side support walls 483, 484, via support hole 475 and received within threaded splice hole 470. As the fastener 495 is rotated or tightened, the fastener 495 draws the threaded splice hole 470 away from a center C of the splice channel 426 and towards the inner side 492 of the toque tube 412. The movement outwardly away from the center C of the splice channel 426 occurs smoothly due to the at least two transition points 232a, 232b, 242a, 242b positioned on either side of the splice hole 470. This transition is complete when the first and second side panels 430, 440 are seated against and generally parallel to the first and second support side panels 483, 484 and the beveled corner panels 450a-d are secured in place. More particularly, in some embodiments, the beveled corner panels 450a-d each include a first and second opposite end 451a, 452a, 451b, 452b, 451c, 452c, 451d, 452d, with a generally planar elongate body therebetween. In the expanded configuration, the first end 451a, 451b, 451c, 451d, of the beveled corner panel 450a-d is positioned against one of the top or bottom support walls 481, 482 of the torque tube 412 and the second opposite end 452a, 452b, 452c, 452d, of the beveled corner panel 450a-d is positioned abutting against one of the first or second support side walls 483, 484 of the torque tube 412. The beveled corner panel 450a-d creates a space 492a-d between a corner of the support structure 412 and the splice 400. The splice 400 in the expanded configuration does not alter the outer perimeter of the torque tube 412. Thereby allowing the torque tube to have added strength without increasing in size.

As shown in FIG. 4C, as the fastener 495 is rotated or tightened, the fastener 495 draws the threaded splice hole 470 away from a center C of the splice channel 426 and towards the toque tube 412 (as indicated by the single arrows pointing towards each other) causing expansion of the splice 400 within the torque tube 412 which generates lines of contact pressure (as indicated by the groups of arrows) that are localized near the corners of the tube 412. The lines of contact pressure localized near the corners of the torque tube 412 provide: the corner regions of the tube 412 with higher stiffness relative to the flat side walls of a typical closed section tube; more efficient load transfer between tubes via the stiffer regions (i.e. less chance for localized deflections under load); and/or corner regions of the tube that are more efficient at transfer of torsion and bending loads because the corners are the most distant areas from a centroid or neutral axis of the tube. (i.e., lower contact load due to maximum radius). Contact near, but not directly in the corners, is an approach that is more robust because it can accommodate manufacturing tolerances between the torque tubes. In embodiments, the magnitude of the contact pressure will be substantially uniform along the length of engagement reducing overall stresses while increasing joint stiffness compared to alternate designs.

Also shown in FIG. 4C are alignment members 425 protruding from the splice 400 and through the top of the tube 412 to center the splice within the tube longitudinally along a length of the tube.

Figure 5:
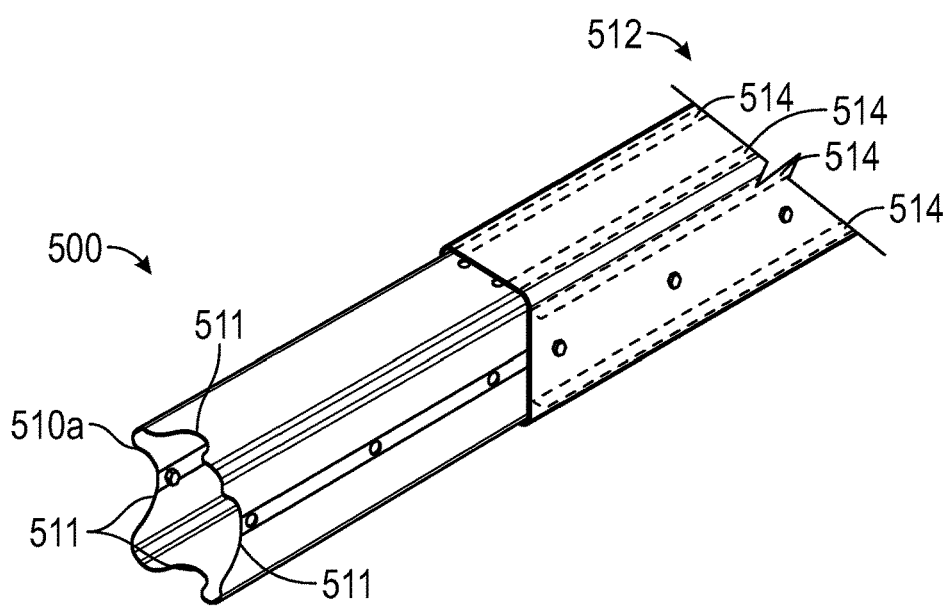
FIG. 5 is a perspective view of an expandable splice as described in at least one embodiment herein.

In some embodiments, as shown in FIG. 1A, an expandable splice 100 as provided herein may include a flat surface or flat edge on or near at least one of the proximal or distal ends 110a, 110b. In some embodiments, as shown in FIG. 5, an expandable splice 500 as provided herein may include a curved surface or curved edge 511 on at least one of the proximal or distal ends (specifically shown for example on the proximal end 510a in FIG. 5). The curved edge being on at least one of the top panel 510, the bottom panel 520, the first side panel 530, the second side panel 540. As depicted, the curved surface or edge 511 extends into the panel or wall longitudinally effectively carving out a portion of the panel or wall. The curved surface or edge 511 locally reduces the stiffness and reduces the stress concentration at the ends of the splice 500. In some embodiments, the curved surface or edge is symmetrical around the perimeter of the end of the splice. In some embodiments, the curved surface or edge is asymmetrical around the perimeter of the end of the splice.

In some embodiments, as further shown in FIG. 5, expansion of the splice 500 inside the tube 512 generates an area of contact pressure 514 near the corners of the tube 512, and particularly along a length of the top panel, bottom panel, and/or side panels of the tube 512, on either side of each corner.

Figure 6:
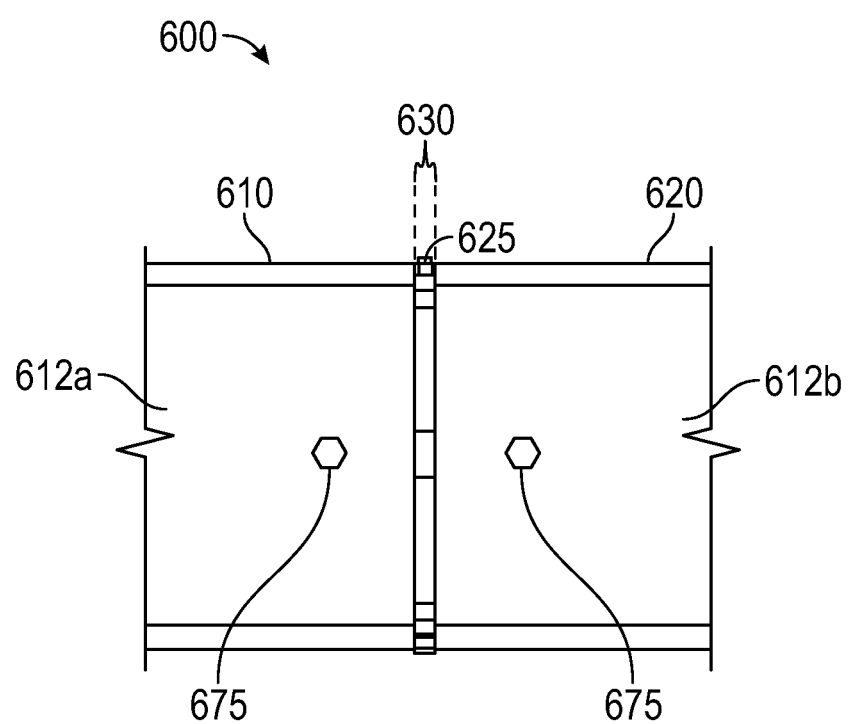
FIG. 6 is a side view of an expandable splice positioned within a tube as described in at least one embodiment herein.

In FIG. 6, in some embodiments, the expandable splice 600 further include at least one alignment tab 625 protruding outwardly from at least one of the top or bottom non-folded surfaces 610, 620 of the splice 600. The one or more alignment tabs 625 provide automatic longitudinal alignment within the torque tube. In some embodiments, a gap 630 exists between neighboring torque tubes 612a, 612b and the one or more alignment tabs 625 are configured to fit within, if not fill completely, the gap 630 between the neighboring torque tubes 612a, 612b. During insertion, the expandable splice 600 may be inserted or slid longitudinally through a first tube 612a and into a neighboring second tube 612b wherein the one or more alignment tabs 625 will include a natural bias to fill the gap 630 between the two tubes as the one or more alignment members 625 exit the first tube 612a and before reaching the second tube 612b. Once the alignment tabs 625 fills the gap 630, the alignment members 625 may also prevent the splice 600 from being advanced or slid further longitudinally into either tube 612a, 612b. The one or more alignment members 625 may also provide automatic alignment of the splice holes with the support holes 675 of the torque tubes 612a, 612b. The one or more alignment members 625 also may indicate the proper placement of the splice 600. In embodiments, the one or more alignment members may be centered on the expandable splice. In some embodiments, the one or more alignment members are at least two spaced apart alignment members.

The expandable splices provided herein are configured as one-piece structures. The splices can be made from any suitable process, including but not limited to, injection molding, compression molding, extrusion molding, thermoforming, sintering, lamination, die-casting, powder metallurgy, forging, stamping, and the like. The splices may be made from any suitable material including but not limited to hard plastics or metals, including polycarbonate, aluminum, steel, copper, and the like.

The support structures provided herein are configured as one-piece structures. The support structures can be made from any suitable process, including but not limited to, injection molding, compression molding, extrusion molding, thermoforming, sintering, lamination, die-casting, powder metallurgy, forging, stamping, and the like. The support structures may be made from any suitable material including but not limited to hard plastics or metals, including polycarbonate, aluminum, steel, copper, and the like.

In some embodiments, the splices described herein are configured to be thinner than the support structures. In some embodiments, the splices described herein are configured to be thicker than the support structures. In some embodiments, the splices described herein are configured to have the same thickness as the support structures.

In some embodiments, the splices described herein may be part of kit for a solar power system. Such kits may include at least one solar module, at least one support structure including a torque tube; and at least one expandable splice as described herein. In some embodiments, the expandable splice is configured to transition between a narrow configuration and an expanded configuration. In some embodiments, the kit includes an expandable splice including a top panel, a bottom panel, a first side panel including a first converging panel attached to a first end of a first median panel and a first diverging panel attached to a second end of the first median panel, the first panel including two bend points, and a second side panel including a second converging panel attached to a first end of a second median panel and a second diverging panel attached to a second end of the second median panel, the second panel including two bend points, wherein the first and second side panels are connected to the top and bottom panels either directly or by the at least one beveled corner panel to form a channel therebetween.

In some embodiments, the kit may include a plurality of framed solar modules, a plurality of support structures, and a plurality of the splices described herein. In addition, the kits described herein may further include additional components commonly associated with the assembly of the solar tracker including, but not limited to, motors, junction boxes, wiring, busbars, ribbons, glass covers, ground support structures, and the like.

It will be understood that various modifications may be made to the embodiments disclosed herein. Therefore, the above description should not be construed as limiting, but merely as an exemplification of preferred embodiments. Those skilled in the art will envision other modifications within the scope and spirit of the present disclosure. Such modifications and variations are intended to come within the scope of the following claims.

What is claimed is:

1. A solar tracker system comprising:
at least one support structure defining a support channel,
an expandable splice positioned within the support channel, wherein the expandable splice includes a plurality of planar beveled corner panels to reinforce the at least one support structure, the plurality of planar beveled corner panels spaced from a corner of the support channel.

2. The solar tracker system of claim 1, wherein the expandable splice is configured to transition between a narrow configuration and an expanded configuration.

3. The solar tracker system of claim 2, wherein the expandable splice in the narrow configuration includes a top panel, a bottom panel, a first side panel including a first converging panel attached to a first end of a first median panel and a first diverging panel attached to a second end of the first median panel, the first side panel including two bend points, and a second side panel including a second converging panel attached to a first end of a second median panel and a second diverging panel attached to a second end of the second median panel, the second side panel including two bend points, wherein the first and second side panels are connected to the top and bottom panels either directly or by the at least one planar beveled corner panel to form a channel therebetween.

4. The solar tracker system of claim 3, wherein the first converging panel of the first side panel of the expandable splice in the narrow configuration is connected to the top panel by a first top planar beveled corner panel.

5. The solar tracker system of claim 4, wherein the first diverging panel of the first side panel of the expandable splice in the narrow configuration is connected to the bottom panel by a first bottom planar beveled corner panel.

6. The solar tracker system of claim 5, wherein the second converging panel of the second side panel of the expandable splice in the narrow configuration is connected to the top panel by a second top planar beveled corner panel.

7. The solar tracker system of claim 6, wherein the second diverging panel of the second side panel of the expandable splice in the narrow configuration is connected to the bottom panel by a second bottom planar beveled corner panel.

8. The solar tracker system of claim 3, wherein at least one of the first median panel and the second median panel of the expandable splice in the narrow configuration further comprises one or more fastening members.

9. The solar tracker system of claim 2, wherein the expandable splice includes the at least one planar beveled corner panel in both the narrow configuration and the expanded configuration.

10. The solar tracker system of claim 1, wherein the expandable splice in the narrow configuration includes at least 10 vertices.

11. The solar tracker system of claim 1, wherein the expandable splice in the narrow configuration includes at least 12 vertices.

12. The solar tracker system of claim 1, wherein the expandable splice further comprises at least one alignment tab protruding outwardly from at least one of a top or bottom panel of the splice.

13. The solar tracker system of claim 3, wherein the expandable splice further comprises a curved edge on at least one of the proximal or distal ends of at least one of the top panel, the bottom panel, the first side panel, or the second side panel.

14. The solar tracker system of claim 1, wherein the support structure is a torque tube.

* * * * *